US010821658B2

(12) United States Patent
Goredema et al.

(10) Patent No.: US 10,821,658 B2
(45) Date of Patent: Nov. 3, 2020

(54) CONDUCTIVE THREE-DIMENSIONAL ARTICLES

(71) Applicant: XEROX CORPORATION, Norwalk, CT (US)

(72) Inventors: Adela Goredema, Ancaster (CA); Chad S. Smithson, Toronto (CA); Michelle N. Chretien, Mississauga (CA); Biby Esther Abraham, Mississauga (CA); Hojjat Seyed Jamali, Mississauga (CA)

(73) Assignee: XEROX CORPORATION, Norwalk, CT (US)

( * ) Notice: Subject to any disclaimer, the term of this patent is extended or adjusted under 35 U.S.C. 154(b) by 220 days.

(21) Appl. No.: 16/044,359

(22) Filed: Jul. 24, 2018

(65) Prior Publication Data

US 2020/0031041 A1 Jan. 30, 2020

(51) Int. Cl.
| | |
|---|---|
| *B29C 64/10* | (2017.01) |
| *C09D 11/52* | (2014.01) |
| *B29C 64/112* | (2017.01) |
| *B22F 1/00* | (2006.01) |
| *B22F 9/24* | (2006.01) |
| *H05K 1/09* | (2006.01) |
| *H05K 3/10* | (2006.01) |
| *B33Y 10/00* | (2015.01) |
| *B33Y 70/00* | (2020.01) |

(52) U.S. Cl.
CPC .......... *B29C 64/112* (2017.08); *B22F 1/0022* (2013.01); *B22F 9/24* (2013.01); *C09D 11/52* (2013.01); *H05K 1/097* (2013.01); *H05K 3/102* (2013.01); *B33Y 10/00* (2014.12); *B33Y 70/00* (2014.12)

(58) Field of Classification Search
CPC ..................................................... C09D 11/52
See application file for complete search history.

(56) References Cited

U.S. PATENT DOCUMENTS

| | | | |
|---|---|---|---|
| 7,270,694 | B2 | 9/2007 | Li et al. |
| 7,381,254 | B2 | 6/2008 | Wu et al. |
| 7,749,300 | B2 | 7/2010 | Chretien et al. |
| 8,287,632 | B1 | 10/2012 | Morimitsu et al. |
| 8,349,970 | B2 | 1/2013 | Faucher et al. |
| 8,465,579 | B2 | 6/2013 | Morimitsu et al. |
| 8,500,896 | B2 | 8/2013 | Morimitsu et al. |
| 8,741,043 | B2 | 6/2014 | Goredema et al. |

(Continued)

OTHER PUBLICATIONS

Printing Metal in Midair, Wyss Institute for Biologically Inspired Engineering at Harvard University, May 16, 2016.

(Continued)

*Primary Examiner* — Cachet I Proctor
(74) *Attorney, Agent, or Firm* — Pillsbury Winthrop Shaw Pittman LLP

(57) ABSTRACT

Disclosed herein is a printing method for forming a three dimensional article. The method includes providing a first 3D structural material; depositing a metal nanoparticle ink composition on a surface of the first 3D structural material; annealing the metal nanoparticle ink composition at a temperature of between 60° C. and 100° C. to form the conductive article on the first 3D structural material; and optionally forming a second 3D structural material over the conductive article.

19 Claims, 2 Drawing Sheets

(56) References Cited

U.S. PATENT DOCUMENTS

| | | | |
|---|---|---|---|
| 8,747,536 B1* | 6/2014 | Morimitsu | C09D 11/38 106/31.29 |
| 8,753,441 B2 | 6/2014 | Vanbesien et al. | |
| 8,952,191 B2 | 2/2015 | Goredema et al. | |
| 8,968,452 B2 | 3/2015 | Goredema et al. | |
| 9,120,943 B2 | 9/2015 | Goredema et al. | |
| 2006/0131770 A1* | 6/2006 | Dierkes | B33Y 80/00 264/16 |
| 2007/0099357 A1* | 5/2007 | Li | B22F 1/0018 438/149 |
| 2007/0296773 A1* | 12/2007 | Sharma | B41J 2/03 347/75 |
| 2009/0148600 A1 | 6/2009 | Li et al. | |
| 2009/0181183 A1 | 7/2009 | Li et al. | |
| 2010/0240758 A1 | 9/2010 | Yoshitake et al. | |
| 2010/0323102 A1* | 12/2010 | Chopra | C09D 11/52 427/125 |
| 2011/0305821 A1* | 12/2011 | Wu | C09D 7/20 427/58 |
| 2013/0344232 A1* | 12/2013 | Chopra | H05K 1/119 427/79 |
| 2015/0004325 A1* | 1/2015 | Walker | C23C 18/168 427/469 |
| 2015/0086805 A1* | 3/2015 | Qi | D01D 5/003 428/605 |
| 2015/0283758 A1 | 10/2015 | Goredema et al. | |
| 2015/0283759 A1 | 10/2015 | Goredema et al. | |
| 2015/0328835 A1* | 11/2015 | Wu | B22F 1/0059 264/642 |
| 2016/0177111 A1* | 6/2016 | Goredema | C09D 11/037 427/126.1 |
| 2017/0104198 A1* | 4/2017 | Duoss | H01M 10/0436 |
| 2017/0253757 A1* | 9/2017 | Salami | H05K 1/097 |
| 2018/0159037 A1* | 6/2018 | McAlpine | H01L 51/0022 |
| 2018/0208785 A1* | 7/2018 | Chopra | H05K 1/092 |

OTHER PUBLICATIONS

V. Chovancova-Lovell, et al. Novel Phase Change Inks for Printing 3D structures, J. of Imaging Science and Technology, 50(6): 550-555, 2006.
U.S. Appl. No. 12/113,628, filed May 1, 2008.
U.S. Appl. No. 16/043,256, filed Jul. 24, 2018.
U.S. Appl. No. 16/043,598, filed Jul. 24, 2018.
U.S. Appl. No. 16/043,660, filed Jul. 24, 2018.

* cited by examiner

CONDUCTIVE THREE-DIMENSIONAL ARTICLES

INTRODUCTION

The present disclosure relates to methods of forming a three-dimensional (3D) article comprising a 3D conductive object. More specifically, the disclosure provides embodiments where the 3D conductive article is formed on a surface of a 3D structural material, or where the 3D conductive article is formed and embedded within a 3D structural material. The disclosure also provides methods of forming a free-standing 3D conductive object on a 3D structural material and then detaching or removing the 3D structural material from the 3D conductive object.

Printing functional articles is an extension of printed electronics, where interactive and multifunctional devices are printed rather than assembled. The ability to print shapes, forms, and structures as well as electronics and other functionalities will pave the way to novel, smart components for automotive and rail, aerospace, military, home appliances, and many other applications.

Conductive 3D articles have many applications in creating smart components for automotive and rail, aerospace, military, home appliances and many other applications. These smart components include functional elements such as conductive tracks and electronics in 3D printed articles. Such functional elements create high value products. Most 3D printed articles are manufactured from polymeric materials. In order to fabricate 3D printed structural electronics, highly conductive materials which are compatible with structural materials used in 3D printing are required. Conductive inks need to be annealed at very high temperatures which can lead to the melting/softening of the polymeric 3D printed structures. There is a need to identify conductive inks that are compatible with structural materials to enable fabrication of conductive 3D articles.

SUMMARY

The present disclosure provides a method of forming a three-dimensional (3D) article comprising a conductive article, the method comprising providing a first 3D structural material; depositing a metal nanoparticle ink composition on a surface of the first 3D structural material; annealing the metal nanoparticle ink composition at a temperature of between 60° C. and 100° C. to form the conductive article on the first 3D structural material; and optionally forming a second 3D structuralmaterial over the conductive article.

In certain embodiments, the disclosure provides a method of forming a 3D article comprising an embedded conductive article, the method comprising providing a first 3D structural material; depositing a conductive metal ink composition on a surface of the first 3D structural material; annealing the conductive metal ink composition at a temperature of between 60° C. and 100° C. to form the conductive article on the first 3D structural material; forming a second 3D structural material over the conductive article, thereby embedding the conductive article therein.

In certain embodiments, the disclosure provides a method of forming a free standing conductive article, comprising the steps of providing a first 3D structural material; depositing a conductive metal ink composition on a surface of the first 3D structural material; annealing the conductive metal ink composition at a temperature of between 60° C. and 100° C. to form the conductive article on the first 3D structural material; and melting the first 3D structural material, thereby forming a free-standing conductive article.

BRIEF DESCRIPTION OF DRAWINGS

Various embodiments of the present disclosure will be described herein below with reference to the figures wherein.

DETAILED DESCRIPTION

Figure 1:
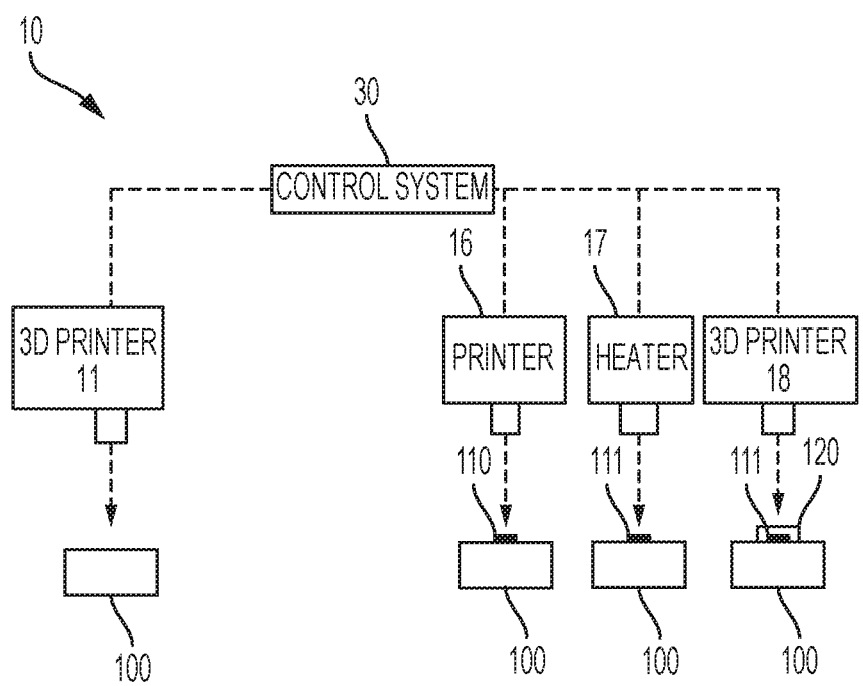
FIG. 1 shows a schematic depiction of a printing system for various embodiments disclosed herein.

In the following description, it is understood that other embodiments may be utilized and structural and operational changes may be made without departure from the scope of the present embodiments disclosed herein.

Disclosed herein provides processes for making a three-dimensional (3D) printed article. The 3D printed article includes a conductive article. In embodiments, the 3D printed article include a conductive article printed on a supportive structural material. In embodiments, the 3D printed article include a conductive article embedded within a structural material. In embodiments, the 3D printed article may be a free-standing parts or objects including a conductive article. In embodiments, the 3D printed article contains solely the conductive article.

3D articles can be built by the incorporation of functional elements such as conductive traces and electronics into 3D printed structures. This enhances functionality and creates high value products. In embodiments, the 3D printed article can be utilized for a variety of different applications, such as, antennas, sensors, inductors, heaters, microsystems, printed circuit boards, light emitting diodes and other electronic components. In order to fabricate 3D printed structural electronics, conductive materials which are compatible with structural materials used in 3D printing are required. Most available conductive inks need to be annealed at high temperatures which can lead to the melting/softening of the polymeric 3D printed structures. There is a need to identify conductive inks that are compatible with structural materials to enable fabrication of conductive 3D articles.

Disclosed herein is a process of forming a 3D printed article. The 3D printed article was fabricated by printing conductive traces or lines on a 3D supportive structural material. The process includes providing a first structural material as a supportive platform. The first structural material may be formed by providing a phase change material; heating the phase change material to a jetting temperature; jetting the phase change material in layers on top of one another, wherein each layer is allowed to cool and/or solidify before jetting a subsequent layer; and forming the first 3D structural material.

The composition of the phase change material is disclosed herein below in more details. The ingredients of the phase change material may be mixed together, followed by heating, to a temperature in embodiments of about 80° C. to about 120° C., and stirring until a homogeneous ink composition is obtained, followed by cooling the phase change material to ambient temperature (typically from about 20° C. to about 25° C.).

The phase change material generally exhibits melt viscosities at the jetting temperature (for example, the jetting temperature may be from about 60° C. to about 125° C., such as from about 80° C. to about 125° C., or from about 100° C. to about 120° C.) of from about 2 to about 30 centipoise, such as from about 5 to about 20 centipoise, or from about 7 to about 15 centipoise.

In embodiments, the phase change material may be jetted at low temperatures, in particular at temperatures below about 130° C., such as from about 60° C. to about 125° C., or from about 80° C. to about 100° C., or from about 100° C. to about 120° C.

There may be a rapid and large increase in ink viscosity upon cooling from the jetting temperature at which the phase change material is in a liquid state, to the gel transition temperature, at which the phase change material converts to the gel state.

The printing process of the first 3D structural material from the phase change material includes allowing the jetted temperature of each jetting layer to cool down to a temperature between about 50° C. to about 25° C., such as between about 45° C. to about 25° C., or between about 40° C. to about 25° C., to solidify before jetting a subsequent layer on top. Layered deposition of the phase change material can be repeated until the 3D structural material of a desirable height and size has been formed. In embodiments, successive layers of the phase change material may be deposited to form a structural material having a selected height and shape, for example, objects of from about 1 to about 10,000 micrometers in height. In embodiments, a thickness of the first and each successive layer of the phase change material may be from about 0.02 to about 6 mm, such as about 0.52 to about 5.5 mm, about 1.02 to about 5 mm, about 1.52 to about 4.5 mm, or from about 2.02 to about 4 mm.

The process includes depositing a metal nanoparticle ink composition on a surface of the first 3D structural material; annealing the conductive metal ink composition at a temperature of between 60° C. and 100° C. to form a conductive article on the first 3D structural material.

The composition of the metal nanoparticle ink composition is disclosed herein below in more details.

The process may further include depositing a second structural material covering the conductive metal article and/or at least partial of the top surface of the first structural material, thereby embedding the conductive metal within the structural material. The conductive metal article may be sandwiched between the first structural material (bottom) and the second structural material (top). The second structural material may be formed by providing a phase change material; heating the phase change material to a jetting temperature; jetting the phase change material in layers on top of one another, wherein each layer is allowed to cool and/or solidify before jetting a subsequent layer; and forming the second 3D structural material.

The phase change material of the second structural material may be the same or different from that of the first structural material. The matter of heating the phase change material of the second structural material may be the same as that of the first structural material.

FIG. 1 shows a schematic depiction of a system 10 for printing according to embodiments disclosed herein. As shown, the system 10 can include a 3D printer 11 programmed to deposit a first second 3D structural material 100. A 3D printer 11 can be an ink jet printer with multiple jetting systems or an aerosol printer with multiple jetting systems or a combination thereof.

A metal nanoparticle ink composition 110 is then applied to the first second 3D structural material 100 by printer 16. Printer 16 can be an aerosol printer or and ink jet printer. The metal nanoparticle ink composition 110 is heated by heater 17, or in embodiments a photonic curing apparatus to anneal the metal conductive ink composition 110 into a conductive trace 111. Photonic curing is achieved using a thermal pulse. The thermal pulse is very fast (milliseconds) so that the 3D structural material does not experience a significant temperature rise during the pulse. Curing the 3D structure at such low temperatures does not affect the structural integrity of the 3D structure.

The heater 17 can include an oven or a heated platen, such as a hotplate or a hot air gun.

The printer system 10 includes a 3D printer 18 for depositing a second 3D build material 120 over the annealed conductive trace 111. Printer 18 can be an aerosol printer or and ink jet printer. The 3D printer 11 and 3D printer 18 can be a single printer. Printer 18 can deposit a thermally or UV curable composition over the conductive trace 111.

Conductive trace 111 is embedded within the first structural material 101 and second structural material 120. In embodiments, the final product is a 3D printed article having conductive traces embedded therein.

In various embodiments, the printers 11, 16 and 18 can be a single printer having multiple printheads connected to reservoirs for the compositions that are coated. Each printhead can be configured to jet a specific composition. The multiple printheads can include aerosol printhead or ink jet printheads or both. For purposes of the discussion below, distinct printers are identified which also refers to a single printer having multiple distinct printheads.

In various embodiments, FIG. 1 shows a printing system 10 for producing a 3D article having an embedded conductive trace. The printing system 10 can include a control system 30 coupled to the 3D printer 11, metal nanoparticle ink printer 16, heating system 17, and a second 3D printer 18. In embodiments, the 3D printer 11 and 3D printer 18 can be one printer and the flow of product adjusted accordingly. In embodiments the 3D printer 11, printer 16 and 3D printer 18 can be one printer with multiple printheads. The control system 30 can be configured to provide instructions to, and/or otherwise control operation of 3D printer 11, metal nanoparticle ink printer 16, heating system 17, second 3D printer 18.

The control system 30 may be mechanically or electrically connected to 3D printer 11, metal conductive ink printer 16, heating system 17, second 3D printer 18. Control system 30 may be a computerized, mechanical, or electro-mechanical device capable of controlling the 3D printer 11, metal nanoparticle ink printer 16, heating system 17, second 3D printer 18. In one embodiment, control system 30 may be a computerized device capable of providing operating instructions to the 3D printer 11, metal nanoparticle ink printer 16, heating system 17, second 3D printer 18. In another embodiment, the control system 30 may include a mechanical device, capable of use by an operator. In this case, the operator may physically manipulate control system 30 (e.g., by pulling a lever), which may actuate the 3D printer 11, metal conductive ink printer 16, heating system 17, second 3D printer 18. In another embodiment, control system 30 may be an electro-mechanical device.

Phase Change Material

A phase change material may be used as a 3D structural material for supporting and/or embedding the conductive article prepared herein on and/or within the printed 3D structural material. The phase change material may include a crystalline compound and an amorphous compound. The weight ratio of the crystalline compound to the amorphous compound is generally from about 60:40 to about 95:5, from about 65:35 to about 95:5, or from about 70:30 to about 90:10. In one embodiment, the weight ratio is 70:30 for the crystalline and amorphous compounds, respectively. In another embodiment, the weight ratio is 80:20 for the crystalline and amorphous compounds, respectively. The weight ratio of the crystalline compound to the amorphous compound in the first structural material may be the same or different from that of the second structural material.

Each component imparts specific properties to the phase change materials, and the blend of the components provides materials that exhibit excellent robustness.

The crystalline compound in the phase change formulation drives the phase change through rapid crystallization on cooling. The crystalline compound also sets up the structure of the final printed object and creates a hard three-dimensional object by reducing the tackiness of the amorphous compound. The crystalline compounds exhibit crystallization, relatively low viscosity (≤12 centipoise (cps), or from about 0.5 to about 10 cps, or from about 1 to about 10 cps) at about 140° C. and high viscosity (>$10^6$ cps) at room temperature. Because the crystalline compounds dictate the phase change of the material, rapid crystallization is required to facilitate the ability to print the next layer faster. By differential scanning calorimetry (DSC) (10° C./min from −50 to 200 to −50° C.), desirable crystalline compounds show sharp crystallization and melting peaks, and the ΔT between them is less than 55° C. The melting point must be below 150° C., to provide jetting at lower temperature, or in embodiments below from about 145 to about 140° C. In embodiments, the melting point is above 65° C. to provide structural integrity after standing at temperatures up to 65° C., or about 66° C., or above about 67° C. Examples of suitable crystalline compounds include dibenzylhexane-1,6-diyldicarbamate (see U.S. Pat. No. 8,968,452), distearyl terepthalate (DST) (see U.S. Pat. No. 8,741,043), di-phenylethyl-(L)-tartarate (see U.S. Pat. No. 8,465,579), polyethylene wax (commercially available from Baker Petrolite, Tulsa, Okla., POLYWAX 500 (PE 500), and mixtures thereof. The disclosures of these applications are hereby incorporated by reference. The structures of the exemplary crystalline compounds are shown as follows:

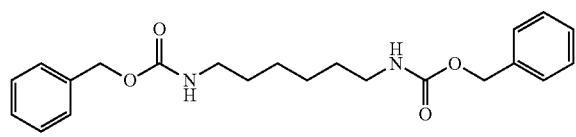

dibenzylhexane-1,6-diyldicarbamate

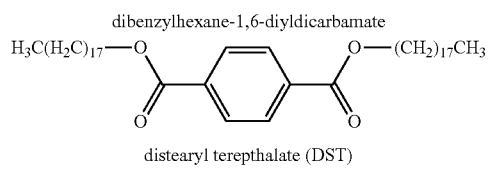

distearyl terepthalate (DST)

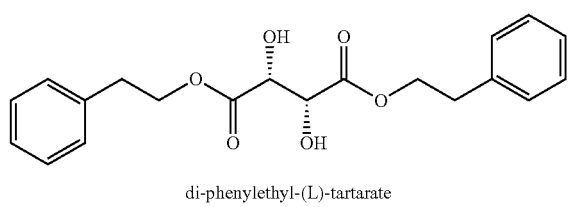

di-phenylethyl-(L)-tartarate

The amorphous compounds provide tackiness and impart robustness to the printed three-dimensional object. In the present embodiments, desirable amorphous compounds have relatively low viscosity (<$10^2$ cps, or from about 1 to about 100 cps, or from about 5 to about 95 cps) at about 140° C., but very high viscosity (>$10^6$ cps) at room temperature. The low viscosity at 140° C. provides wide formulation latitude while the high viscosity at room temperature imparts robustness. The amorphous compounds have $T_g$ (glass transition temperatures) but do not exhibit crystallization and melting peaks by DSC (10° C./min from −50 to 200 to −50° C.). The $T_g$ values are typically from about 1 to about 50° C., or from about 1 to about 40° C., or from about 1 to about 35° C., to impart the desired toughness and flexibility to the phase change materials. The selected amorphous compounds have low molecular weights, such as less than 1000 g/mol, or from about 100 to about 1000 g/mol, or from about 200 to about 1000 g/mol, or from about 300 to about 1000 g/mol. Higher molecular weight amorphous compounds such as polymers become viscous and sticky liquids at high temperatures, but have viscosities that are too high to be jettable with printheads at desirable temperatures.

In specific embodiments, the amorphous compound is a di-ester of menthol and tartaric acid (DMT), and isomers (see, U.S. Pat. No. 8,500,896). Tartaric acid may be a bio-renewable material which is a common by-product from the wine industry. Menthol may also be bio-renewable, depending on where it is sourced. The structure of DMT is shown below:

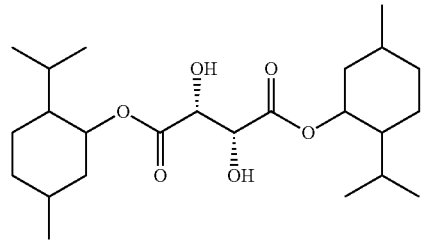

dimenthol tartarate (DMT); Tg = 11-16° C.

In embodiments, the amorphous compound is an ester of a mixture of cyclohexanol, t-butylcyclohexanol and tartaric acid (1:1:1 molar ratio). TBCT may be synthesized according to the disclosure outlined in U.S. Pat. No. 8,500,896, which is hereby incorporated by reference. The structure of TBCT is shown below:

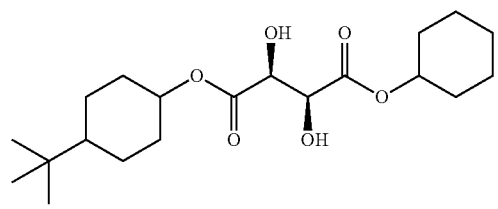

t-butylcyclohexyl-cyclohexyl tartrate (TBCT); Tg = 5° C.

In embodiments, the amorphous compound is trimenthol citrate (see U.S. Pat. No. 8,287,632) which is hereby incorporated by reference) having the following structure:

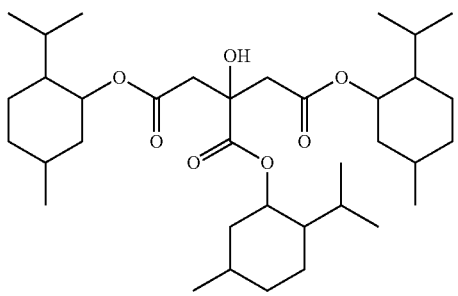

trimenthol citrate (TMC); Tg = 6° C.

Other suitable amorphous compounds for the phase change material include rosinated or rosin ester, which may be a mono-, di-, tri-tetra-ester based on an alcohol such as methanol, glycercol (1,2,3-trihydroxypropane), diethylene glycol, ethylene glycol, propylene glycol, dipropylene glycol, menthol, neopentylglycol, pentaerythritol (2,2-bis(hydroxymethyl)1,3-propanediol), phenol, tertiary butyl phenol, and an acid such as tartaric acid, citric acid, oxalic acid, succinic acid, glutaric acid, adipic acid, suberic acid, azelaic acid, fumaric acid, maleic acid, dodecanedioic acid, and sebacic acid. Suitable rosinated esters, without limitation, include those with about 16 to about 80 carbon atoms, including those with a number average molecular weight Mn of about 300 to about 1200, and a weight average molecular weight Mw of about 300 to about 2000. Suitable rosinated esters, without limitation, have an acid number of about 0 to about 300. Optionally monoesters, including monoesters with some acid functionality can be incorporated, including rosin acids, with an acid value of about 30 to about 400. As used herein, a "rosinated ester" or "rosin ester" synonymously refers to rosin acids that have been esterified. Such rosin acids may include naturally occurring resinous acids exuded by various species of trees, primarily pine and other conifers. Suitable rosin esters that are available commercially include ABALYN® a rosin methyl ester, PENTALYN® A a rosin pentaerythritol ester, PEXALYN® 9085 a rosin glycerol ester, PEXALYN® T a rosin pentaerythritol ester, PINOVA® Ester Gum 8BG a rosin glycerol ester, FORAL® 85 a hyrogentated rosin glycerol ester, FORAL® 105 a pentaerythritol ester of hydroabietic (rosin) acid, FORAL® 3085 a hydrogenated rosin glycerol ester, HERCOLYN® D a hydrogenated rosin methyl ester, PENTALYN® H a rosin pentaerythritol ester, all available commercially from Pinova; ARAKAWA® Ester Gum G, ARAKAWA® Ester Gum AA-L, ARAKAWA® Ester Gum AAV ARAKAWA® Ester Gum AT rosin esters commercially available from Arakawa Chemical Industries, Ltd.; ARAKAWA® Ester Gum HP, ARAKAWA® Ester Gum H, ARAKAWA® Ester Gum HT hydrogenated rosin esters commercially available from Arakawa Chemical Industries, Ltd.; ARAKAWA® S-80, ARAKAWA® S-100, ARAKAWA® S-115, ARAKAWA® A-75, ARAKAWA® A-100, ARAKAWA® A-115, ARAKAWA® A-125, ARAKAWA® L, ARAKAWACA-18 stabilized rosin esters commercially available from Arakawa Chemical Industries, Ltd.; ARAKAWA® KE-311 and KE-100 resins, triglycerides of hydrogenated abietic (rosin) acid commercially available from Arakawa Chemical Industries, Ltd.; ARAKAWA® KE-359 a hydrogenated rosin ester and ARAKAWA® D-6011 a disproportionated rosin ester commercially available from Arakawa Chemical Industries, Ltd.; and SYLVALITE® RE 10L, SYLVALITE® RE 80HP, SYLVALITE® RE 85L, SYLVALITE® RE 100XL, SYLVALITE® RE 100L, SYLVALITE® RE 105L, SYLVALITE® RE 110L. SYLVATAC® RE 25, SYLVATAC® RE 40, SYLVATAC® RE 85, SYLVATAC® RE 98 all available from Arizona Chemical; and PERMALYN™ 5095 a rosin glycerol ester, PERMALYN™ 5095-C a rosin glycerol ester, PERMALYN™ 5110 a rosin pentaerythritol ester, PERMALYN™ 5110-C, a rosin pentaerythritol ester, PERMALYN™ 6110 a rosin pentaerythritol ester, PERMALYN™ 6110-M a rosin pentaerythritol ester, PERMALYN™ 8120 a rosin pentaerythritol ester, STAYBELITE™ Ester 3-E a partially hydrogenated rosin ester, STAYBELITE™ Ester 5-E a partially hydrogenated rosin ester, and STAYBELITE™ Ester 10-E a partially hydrogenated rosin ester all available from Eastman Kodak; and ARAKAWA® ESTER E-720 and SUPER ESTER E-730-55 rosin ester latexes commercially available from Arakawa Chemical Industries, Ltd.

Yet other suitable amorphous compounds for the phase change material include esters of succinic acid or tartaric acid and Abitol E alcohol with the following structures:

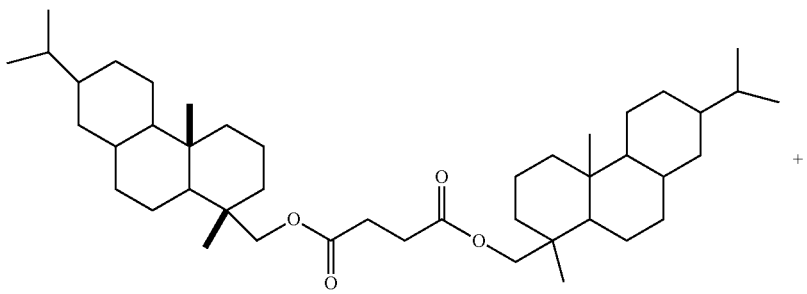

-continued

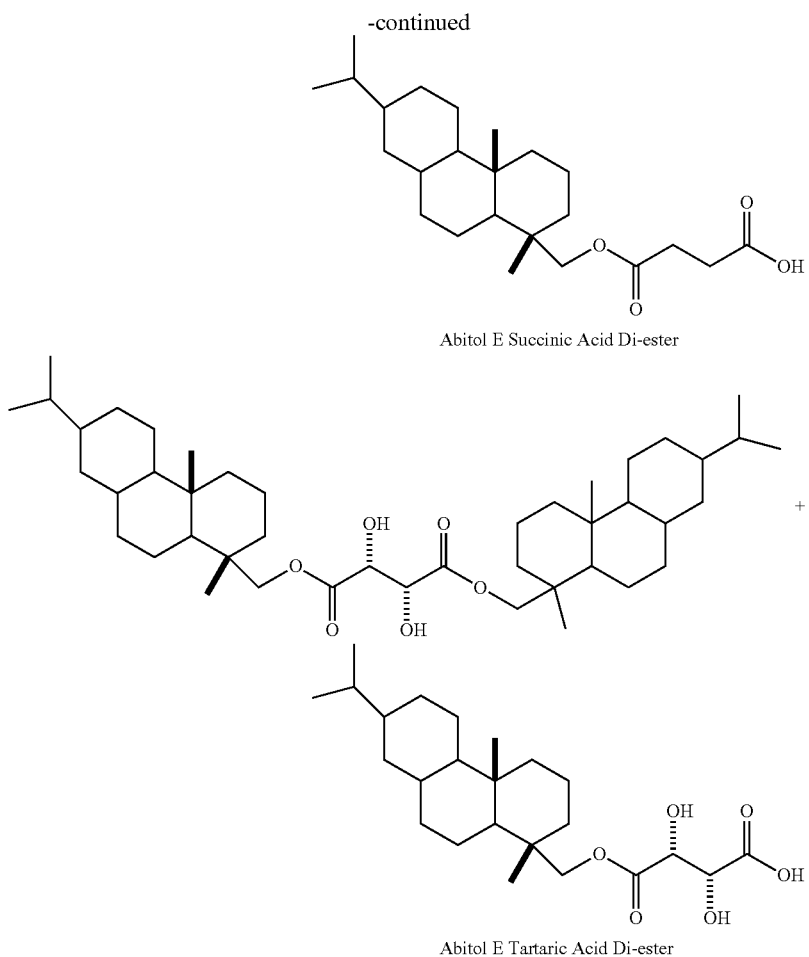

Abitol E Succinic Acid Di-ester

Abitol E Tartaric Acid Di-ester

To synthesize the amorphous component, succinic acid or tartaric acid was reacted with ABITOL E™ alcohol (available from Hercules, Inc. (Wilmington, Del.). ABITOL E is shown by a representative structure, and comprises hydroabietyl alcohol (CAS[13393-93-6]), methyl ester of hydrogenated rosin (CAS[8050-15-5]), and decarboxylated rosin (CAS[8050-18-8])). Abitol E is a resin derived from pine sap and bio-based succinic acid available from corn or Sorghum.

In embodiments, the amorphous compound is selected from the group consisting of ester resins (e.g., KE-100 resin (triglycerides of hydrogenated abietic (rosin) acid obtained from Arakawa Chemical Industries (USA), Inc., Chicago, Ill.), Abitol E succinic acid, Abitol E tartaric acid, dimenthol tartrate, t-Butylcyclohexyl-Cyclohexyl Tartrate, trimenthol citrate, and mixtures thereof.

In embodiments, the carriers for the phase change materials may have melting points of from about 65° C. to about 150° C., for example from about 70° C. to about 140° C., from about 75° C. to about 135° C., from about 80° C. to about 130° C., or from about 85° C. to about 125° C. as determined by, for example, by differential scanning calorimetry at a rate of 10° C./min. In embodiments, the resulting phase change material has a melting point of from about 65 to about 140° C., or from about 65 to about 135° C., or from about 70 to about 130° C. In embodiments, the resulting phase change material has a crystallization point of from about 65 to about 130° C., or from about 66 to about 125° C., or from about 66 to about 120° C. In further embodiments, the resulting phase change material has a viscosity of from about 1 to about 15 cps, or from about 2 to about 14 cps, or from about 3 to about 13 cps at about 140° C. The phase change materials of the present embodiments provide quick solidification upon cooling. In embodiments, the phase change materials reach a solid form having a viscosity of greater than $1 \times 10^6$ cps within a time period of from about 5 to about 15 seconds or from about 5 to about 8 seconds upon cooling. As used herein, "cooling" means the removal of heat and return to ambient temperature. Specifically, at about 30° C., the resulting phase change material is a robust solid having a viscosity of from about $10^4$ cps to about $10^6$ cps.

The phase change materials of the present embodiments may further include conventional additives to take advantage of the known functionality associated with such conventional additives. Such additives may include, for example, at least one antioxidant, defoamer, slip and leveling agents, clarifier, viscosity modifier, adhesive, plasticizer and the like.

The phase change may optionally contain antioxidants to protect the formed objects from oxidation and also may protect the phase change material components from oxidation while existing as a heated and melted material in the printer reservoir. Examples of suitable antioxidants include N,N'-hexamethylene bis(3,5-di-tert-butyl-4-hydroxy hydrocinnamamide) (IRGANOX 1098, available from BASF); 2,2-bis(4-(2-(3,5-di-tert-butyl-4-hydroxyhydrocinnamoyloxy))ethoxyphenyl)propane (TOPANOL-205, available from Vertellus); tris(4-tert-butyl-3-hydroxy-2,6-dimethyl benzyl)isocyanurate (Aldrich); 2,2'-ethylidene bis(4,6-di-tert-butylphenyl)fluoro phosphonite (ETHANOX-398, available from Albermarle Corporation); tetrakis(2,4-di-tert-butylphenyl)-4,4'-biphenyl diphosphonite (Aldrich); pentaerythritol tetrastearate (TCI America); tributylammonium hypophosphite (Aldrich); 2,6-di-tert-butyl-4-methoxyphenol (Aldrich); 2,4-di-tert-butyl-6-(4-methoxybenzyl)phenol (Aldrich); 4-bromo-2,6-dimethylphenol (Aldrich); 4-bromo-3,5-didimethylphenol (Aldrich); 4-bromo-2-nitrophenol (Aldrich); 4-(diethyl aminomethyl)-2,5-dimethylphenol (Aldrich); 3-dimethylaminophenol (Aldrich); 2-amino-4-tert-amylphenol (Aldrich); 2,6-bis(hydroxymethyl)-p-cresol (Aldrich); 2,2'-methylenediphenol (Aldrich); 5-(diethylamino)-2-nitrosophenol (Aldrich); 2,6-dichloro-4-fluorophenol (Aldrich); 2,6-dibromo fluoro phenol (Aldrich); α-trifluoro-o-cresol (Aldrich); 2-bromo-4-fluorophenol (Aldrich); 4-fluorophenol (Aldrich); 4-chlorophenyl-2-chloro-1,1,2-tri-fluoroethyl sulfone (Aldrich); 3,4-difluoro phenylacetic acid (Adrich); 3-fluorophenylacetic acid (Aldrich); 3,5-difluoro phenylacetic acid (Aldrich); 2-fluorophenylacetic acid (Aldrich); 2,5-bis(trifluoromethyl)benzoic acid (Aldrich); ethyl-2-(4-(4-(trifluoromethyl)phenoxy)phenoxy)propionate (Aldrich); tetrakis (2,4-di-tert-butyl phenyl)-4,4'-biphenyl diphosphonite (Aldrich); 4-tert-amyl phenol (Aldrich); 3-(2H-benzotriazol-2-yl)-4-hydroxy phenethylalcohol (Aldrich); NAUGARD 76, NAUGARD 445, NAUGARD 512, and NAUGARD 524 (manufactured by Chemtura Corporation); and the like, as well as mixtures thereof. The antioxidant, when present, may be present in the phase change material in any desired or effective amount, such as from about 0.25 percent to about 10 percent by weight of the phase change material or from about 1 percent to about 5 percent by weight of the phase change material.

In embodiments, the phase change materials described herein also include a colorant. The phase change material may optionally contain colorants such as dyes or pigments. The colorants can be either from the cyan, magenta, yellow, black (CMYK) set or from spot colors obtained from custom color dyes or pigments or mixtures of pigments. Dye-based colorants are miscible with the base composition, which comprises the crystalline and amorphous compounds and any other additives.

The phase change material can be prepared by any desired or suitable method, for example, as disclosed in U.S. Patent Publication No. 2015/0283758 which is hereby incorporated by reference.

Metal Nanoparticle Ink Composition

The metal nanoparticle ink composition comprises an ink vehicle and a plurality of metal nanoparticles dispersed in the ink vehicle. The metal nanoparticles include both a first organic stabilizing group and a second organic stabilizing group attached thereto. The alkyl moiety of the first organic stabilizing group has a longer carbon chain length than the alkyl moiety of the second organic stabilizing group. As will be discussed in greater detail below, the first organic stabilizing group can be selected from the group consisting of decylamine, undecylamine, dodecylamine, tridecylamine, tetradecylamine and mixtures thereof. The second organic stabilizing group can be selected from group consisting of butylamine, pentylamine, hexylamine, heptylamine, octylamine, nonylamine, decylamine and mixtures thereof.

By employing organic stabilizers having at least two different carbon chain lengths, one or more benefits can be achieved, such the ability to form relatively small nanoparticles and/or relatively low annealing temperatures for conductive inks made by the particles, as will be discussed in greater detail herein.

The term "nano" as used in "metal nanoparticles" refers to, for example, a particle size of 100 nm or less, such as, for example, from about 0.5 nm to about 100 nm, for example, such as from about 1 nm to about 70 nm, or from about 1 nm to about 50 nm, from about 1 nm to about 25 nm, or from about 1 nm to about 10 nm. The particle size refers to the average diameter of the metal particles, as determined by TEM (transmission electron microscopy) or DLS (dynamic light scattering), such as, for example, a Zave particle size as reported using Malvern dynamic light scattering techniques. Generally, a plurality of particle sizes may exist in the metal nanoparticles obtained from the process described herein. In embodiments, the existence of different sized metal-containing nanoparticles is acceptable.

In embodiments, the metal nanoparticles are composed of (i) one or more metals or (ii) one or more metal composites. Any suitable metals can be employed. Examples of metals include Al, Ag, Au, Pt, Pd, Cu, Co, Cr, In, and Ni, particularly the transition metals, such as, Ag, Au, Pt, Pd, Cu, Cr, Ni, and mixtures thereof. Suitable metal composites may include Au—Ag, Ag—Cu, Ag—Ni, Au—Cu, Au—Ni, Au—Ag—Cu, and Au—Ag—Pd. The metal composites may also include non-metals, such as, for example, Si, C, and Ge. The various components of the metal composite may each be present in the composite in any amount, such as amounts ranging for example from about 0.01% to about 99.9% by weight, particularly from about 10% to about 90% by weight, with the amounts being adjusted to provide desired characteristics, such as to provide the desired conductivities for the resulting printed features.

In an embodiment, the metal nanoparticles comprise silver. For example, the metal of the nanoparticles can be a metal alloy composed of silver and one, two or more other metals, with silver comprising, for example, at least about 20% of the nanoparticles by weight, particularly greater than about 50% of the nanoparticles by weight. Unless otherwise noted, the weight percentages recited herein for the components of the metal nanoparticles do not include the weight of any stabilizer or oxide formation that may be part of the nanoparticle.

The metal nanoparticles may be a mixture of two or more bimetallic metal nanoparticle species, such as those described in commonly assigned U.S. patent application Ser. No. 12/113,628 to Naveen Chopra et al., filed May 1, 2008 (now abandoned), which is incorporated herein by reference in its entirety, or a bimodal metal nanoparticle, such as those described in U.S. patent application Ser. No. 12/133,548 to Michelle N. Chretien filed Jun. 5, 2008 now U.S. Pat. No. 7,749,300, which is also incorporated herein by reference in its entirety.

The ink compositions of the present disclosure can include any suitable amount of metal nanoparticles. In an embodiment, the metal nanoparticles are in a concentration ranging from about 10 wt. % to about 90 wt. %, such as about 30 wt. % to about 80 wt. %, such as about 40 wt. % to about 70 wt. %, based on the total weight of the ink composition.

The metal nanoparticles can optionally include one or more organic stabilizing groups, such as both a first stabilizing group and a second stabilizing group, attached thereto to form a stabilized nanoparticle complex. Stabilizing groups (which may be referred to herein as stabilizers, stabilizer groups or ligands) are generally well known in the art for enhancing or maintaining the dispersibility of nanoparticles and/or to reduce aggregation of the nanoparticles in the composition. The term "attached" in the context of the stabilizing groups being attached to the nanoparticles means that the stabilizer is generally physically or chemically associated with the surface of the nanoparticles. In this way, the nanoparticles (e.g., silver nanoparticles or other metal nanoparticles described herein) have the stabilizer thereon outside of a liquid solution. That is, the nanoparticles with the stabilizer thereon may be isolated and recovered from a reaction mixture solution used in forming the nanoparticle and stabilizer complex. The stabilized nanoparticles may thus be subsequently readily and homogeneously dispersed in a solvent for forming a printable liquid.

As used herein, the phrase "physically or chemically associated" used to describe the attachment between the nanoparticles and the stabilizer may be a chemical bond and/or other physical attachment. The chemical bond may take the form of, for example, covalent bonding, hydrogen bonding, coordination complex bonding, or ionic bonding, or a mixture of different chemical bonds. The physical attachment may take the form of, for example, van der Waals' forces or dipole-dipole interaction, or a mixture of different physical attachments. The stabilizer can be attached to the nanoparticle via a linking group or directly to the nanoparticle itself.

The term "organic" in "organic stabilizing group" or "organic stabilizer" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those described in U.S. Pat. No. 7,270,694, which is incorporated by reference herein in its entirety. In an embodiment, the first organic stabilizing group is selected from the group consisting of decylamine, undecylamine, dodecylamine, tridecylamine, tetradecylamine and mixtures thereof. In an embodiment, the second organic stabilizing group is selected from group consisting of butylamine, pentylamine, hexylamine, heptylamine, octylamine, nonylamine, decylamine and mixtures thereof. For example, the first organic stabilizing group can be selected from the group consisting of hexylamine, heptylamine, octylamine, nonylamine, decylamine, and mixtures thereof, and the second organic stabilizing groups can be selected from the group consisting of undecylamine, dodecylamine and tridecylamine, and mixtures thereof.

In an embodiment, additional stabilizers that are different from the first and second stabilizers may be used. For example, additional stabilizers can optionally be chosen from any of butylamine, pentylamine, hexylamine, heptylamine, octylamine, nonylamine, decylamine, undecylamine, and dodecylamine. In an embodiment, a first of the two or more organic stabilizing groups is dodecylamine. In an embodiment, the two or more organic stabilizing groups include a second organoamine in addition to dodecylamine, the second organoamine being selected from the group consisting of hexylamine, heptylamine, octylamine, nonylamine and decylamine. In an embodiment, the second organoamine is octylamine.

As shown in the examples herein below, in one embodiment, the nanoparticles of the present disclosure may be effectively stabilized using a mixture of octylamine and dodecylamine binders. The use of both octylamine and dodecylamine resulted in stabilized silver particles of small size (e.g. less than 100 nm) and with a lower annealing temperature than a particle made with 100% dodecylamine stabilizer. On the other hand, the use of octylamine alone (e.g., without dodecylamine) did not provide the desired stabilization and so resulted in particles that were too large. Inks formulated from the particles that were made in one particular embodiment using both dodecylamine and octylamine are able to be annealed at low temperatures (e.g., 80° C. or less) in a short time (10-30 minutes) to give highly conductive traces (>10,000 s/cm). Such low anneal temperatures can enable the printing of conductive traces on many substrates that are sensitive to high temperatures, such as plastic films and other polymeric objects. It will also allow low temperature deposition of conductors (e.g. electrodes and other conductive elements) on polymer parts made by 3D printing, thereby making it possible to create smart components for many applications.

While the examples of the present disclosure employ dodecylamine and octylamine, it is expected that certain other combinations of organoamines could also be employed to achieve reduced annealing temperatures when compared with dodecylamine alone. For instance, based on the results using octylamine and dodecylamine, it is expected that any one of hexylamine, heptylamine, nonylamine and decylamine could be used in combination with dodecylamine to achieve an anneal temperature that is lower than if dodecylamine were used alone. It is also expected that dodecylamine together with various combinations of two or more of hexylamine, heptylamine, octylamine, nonylamine, decylamine and undecylamine could be employed to achieve an anneal temperature that is lower than if dodecylamine were used alone.

The organoamines can be attached to the nanoparticles in any desired manner, such as via a carboxylate linking group or other carboxylic acid derived linking group, as in the carboxylic acid-organoamine complex stabilized silver nanoparticles mentioned herein. The organoamines may, after attachment to the silver nanoparticles, potentially be considered groups other than amines, such as amide groups and so forth. However, for purposes of this disclosure, it is to be understood that when referring to organoamines either prior to or after attachment to the nanoparticle, the organoamines are named based on their structures prior to attachment to the silver nanoparticle, whether or not they remain amines after attachment.

Where two or more stabilizers are used, each stabilizer may be present either in the composition employed for making the nanoparticles, or as part of the final nanoparticle product, at any suitable weight ratio, such as for example, from about 99 (first stabilizer):1 (second stabilizer) to about 1 (first stabilizer):99 (second stabilizer). As additional examples, where a first and second organoamine are used, any suitable ratio of the first organoamine to the second organoamine can be used that will provide the desired small particle sizes and low temperature anneal. For instance, the molar ratio of the first organoamine to the second organoamine employed in the compositions for making the nanoparticles can range from about 1:5 to about 5:1, such as about 1:4 to about 4:1, or about 1:3 to about 3:1, or about 3:2 to about 2:3, or about a 1:1 ratio. In an embodiment where the first organoamine is dodecylamine and the second organoamine is octylamine, the amounts of organoamines employed to make the nanoparticles can range, for example, from about 30 mole % to about 80 mole %, such as about 35 mole % to about 75 mole %, octylamine and about 70 mole % to about 20 mole %, such as about 65 mole % to about 25 mole %, dodecylamine, based on the total molar amount of organoamine (e.g., total amount of octylamine and dodecylamine) added as a stabilizer for making the metal-containing nanoparticles. In another embodiment, the range is about 40 mole % to about 60 mole % octylamine and about 60 mole % to about 40 mole % of dodecylamine, or about 45 mole % to about 55 mole % octylamine and about 55 mole % to about 45 mole % of dodecylamine, or about 50 mole % octylamine and about 50 mole % of dodecylamine, based on the total molar amount of organoamine added as a stabilizer for making the metal-containing nanoparticles.

The amount of the stabilizer used is, for example, from about 1 or more molar equivalents per mole of silver compound, or about 2 or more molar equivalents per mole of silver compound, or about 10 or more molar equivalents per mole of silver compound, or about 25 or more molar equivalents per mole of silver compound. Amounts outside of the range of about 1 to about 25 molar equivalents per mole of silver compound can also be employed.

Examples of other organic stabilizers include thiol and its derivatives, —OC(=S)SH (xanthic acid), polyethylene glycols, polyvinylpyridine, polyvinylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize metal nanoparticles may also be used as a potential stabilizer.

Examples of stabilized metal nanoparticles include: the carboxylic acid-organoamine complex stabilized silver nanoparticles, described in U.S. Patent Application Pub. No. 2009/0148600; the carboxylic acid stabilizer silver nanoparticles described in U.S. Patent Application Pub. No. 2007/0099357 A1, and the thermally removable stabilizer and the UV decomposable stabilizers described in U.S. Patent Application Pub. No. 2009/0181183, each of which is incorporated by reference herein in its entirety.

The ink vehicle employed for the metal nanoparticle ink composition include a first solvent and a second solvent. The first solvent is nonpolar and has a boiling point above 160° C. at 1 atmosphere pressure. The second solvent is an aromatic hydrocarbon and has a boiling point above 230° C. at 1 atmosphere pressure, which is a higher boiling point than that of the first solvent.

The first solvent, which is a nonpolar solvent having a boiling point above 160° C. at 1 atmosphere pressure, can provide good dispersion stability for the organoamine stabilized metal nanoparticles of the present disclosure. In an embodiment, the dispersibility of the first solvent for silver nanoparticles can be better than that of the second solvent. It is noted that the term "solvent" is defined broadly herein to included compounds that act to disperse, rather than dissolve, the solid nanoparticles, although the solvents may optionally provide solubility for one or more other ingredients in the ink composition.

In an embodiment, the first solvent is a hydrocarbon. The term "hydrocarbon" for purposes of the present disclosure refers to an organic compound consisting entirely of hydrogen and carbon.

Examples of suitable first solvents include saturated or unsaturated C10 to C20 hydrocarbons having at least one cyclic group. In an embodiment, the at least one cyclic group can be a saturated or unsaturated 6 carbon group, such as a hexyl group. In an embodiment, the compound includes at least two saturated or unsaturated 6 carbon cyclic groups, which can be linked or fused, where one or both of the cyclic groups are optionally substituted with a linear or branched C1 to C8 hydrocarbyl group, such as methyl, ethyl, propyl or butyl. As an example, the first solvent can be a compound selected from the group consisting of bicyclohexane, decalin, naphthalene and combinations thereof, any of which can be unsubstituted or substituted with a linear or branched C1 to C8 hydrocarbyl group.

The first solvent can have a boiling point that is greater than 160° C. For example, the boiling point can range from about 180° C. to about 240° C., or about 200° C. to about 235° C., or about 220° C. to about 230° C., at 1 atmosphere pressure. The relatively high boiling point of the first solvent may correlate to a relatively low vapor pressure.

The second solvent can be any aromatic hydrocarbon that has a relatively high boiling point above 230° C. at 1 atmosphere pressure while still providing good dispersing characteristics for the metal nanoparticles. In an embodiment, the aromatic hydrocarbon can include a phenyl group substituted with one or more linear, branched or cyclic hydrocarbyl groups of sufficient length so as to provide the desired boiling point. In an embodiment, the second solvent is a C10 to C18 arylcycloalkane, such as phenylcyclohexane.

The second solvent can have a boiling point that is greater than 230° C. For example, the boiling point can range from about 235° C. to about 300° C., or about 235° C. to about 260° C., or about 235° C. to about 245° C., or about 240° C., at 1 atmosphere pressure. The relatively high boiling point of the second solvent is higher than that of the first solvent and may also correlate to a relatively low vapor pressure that is lower than that of the first solvent.

The combination of both the first solvent and the second solvent facilitates the dispersion of the metal nanoparticles and provides a uniform, stable nanoparticle dispersion. In an embodiment, the dispersion will remain stable for a period of time, such as a day, a week or a month or more, at room temperature. In an embodiment, the dispersion will remain stable for at least six months, such as a year or longer at a temperature of 5° C. Further, the solvent combination may help to reduce or prevent aggregation of the nanoparticles. By incorporating certain amounts of the first and second solvents in the metal nanoparticle ink formulation, the ink printing properties, such as latency, can be improved.

Any other suitable solvents can optionally be employed in the compositions of the present disclosure in addition to the first and second solvents. In an embodiment, any optional solvents that are included are non-aqueous, polar or non-polar organic solvents. Examples of optional solvents may include, for example, aromatic hydrocarbons other than the second solvent, such as benzene, toluene, xylene, ethylbenzene, chlorobenzene, dichlorobenzene, trichlorobenzene, nitrobenzene, cyanobenzene and tetralin; an alkane, alkene or an alcohol having from about 10 to about 18 carbon atoms such as, undecane, dodecane, tridecane, tetradecane, hexadecane, hexadecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; an alcohol, such as for example, terpineol (α-terpineol), β-terpineol, geraniol, cineol, cedral, linalool, 4-terpineol, lavandulol, citronellol, nerol, methol, borneol, hexanol, heptanol, cyclohexanol, 3,7-dimethylocta-2,6-dien-1-ol, 2-(2-propyl)-5-methyl-cyclohexane-1-ol and the like; isoparaffinic hydrocarbons, such as, for example, isodecane, isododecane, and commercially available mixtures of isoparaffins such as ISOPAR® E, ISOPAR G, ISOPAR H, ISOPAR L and ISOPAR M (all the above-mentioned ISOPAR products are manufactured by Exxon Chemical Company), SHELL-SOL® (made by Shell Chemical Company), SOLTROL® (made by Philips Oil Co., Ltd.), BEGASOL® (made by Mobil Petroleum Co., Inc.) and IP Solvent 2835 (made by Idemitsu Petrochemical Co., Ltd.); naphthenic oils; ethers, such as tetrahydrofuran; nitriles, such as acetonitrile; halogenated solvents, such as dichloromethane; amides such as N,N-dimethylformamide (DMF); and mixtures of any of the above solvents. One, two, three or more of the optional solvents may be used in addition to the first and second solvents.

The first and second solvents may be present at any suitable ratio. For example, a ratio by weight of the first solvent to the second solvent can range from about 99:1 to about 1:99, or from about 80:20 to about 20:80, or from about 70:30 to about 30:70. In an embodiment, more of the first solvent is employed than the second solvent.

In an embodiment where an optional polar solvent is employed, it may be used in relatively small amounts compared to the nonpolar solvents in the mixture. For example, the weight ratio of polar to nonpolar solvents can be less that 2:3, such as 1:2, 1:3, 1:4, 1:5 or 1:10 or less. In an embodiment, no optional solvents are added, so that substantially only the first and second solvents are included except minor amounts that may be added with the other ingredients (e.g., less than 10% by weight, such as 5% or 2% or 1% by weight or less, based on the total weight of the ink composition).

The total amount of the first and second solvents may be present in the metal nanoparticle ink composition in an amount of at least 10 wt. %, based on the wt. % of the entire composition, such as, for example from about 10 wt. % to about 90 wt. %, from about 20 wt. % to about 80 wt. %, from about 30 wt. % to about 70 wt. % and from about 40 wt. % to about 60 wt. % of the ink composition. In an embodiment, the total amount of the first and second solvents is included in the ink composition in an amount that is at least 50 wt. %, based on the wt. % of the entire ink composition.

Example viscosity ranges for the metal nanoparticle ink compositions range from about 1 to 30 cps, such as about 2 to 20 cps, or about 3 to 15 cps at 25° C.

EXAMPLES

The examples set forth herein below are illustrative of different compositions and conditions that can be used in practicing the present embodiments. All proportions are by weight unless otherwise indicated. It will be apparent, however, that the present embodiments can be practiced with many types of compositions and can have many different uses in accordance with the disclosure above and as pointed out hereinafter.

Example 1: Preparation of Dodecylamine-Stabilized Silver Nanoparticles

To a 3-neck round-bottom reaction flask, dodecylamine (444.55 g), decalin (150 mL), and methanol (30 mL) were added and the mixture was heated with good stirring up to ~37° C. until dodecylamine was dissolved. Then, a reducing agent phenylhydrazine (32.70 g) was added to the solution with good stirring for ~5 minutes. Silver acetate (100 g) was added gradually in duration of ~1.5 to 2.0 hours at a temperature range of 35 to 38° C. The color of the reaction mixture was changed from clear to dark brownish during the addition, indicating the formation of silver nanoparticles. After the addition, the reaction mixture was heated to 40° C. and was stirred at this temperature for one hour.

The crude product was precipitated by adding 750 mL of MeOH with good stirring for 10 minutes and then collected by filtration. The collected wet cake was transferred to a glass beaker and stirred in 250 mL of methanol for 30 minutes twice. The final product was collected by filtration and dried in a vacuum oven at room temperature for 24 hours, yielding 68.3 g of stabilized silver nanoparticles with dark blue color.

Example 2: Preparation of New Silver Nanoparticle Ink

A new silver nanoparticle ink sample was prepared from the silver nanoparticles of Example 1. The ink contained approximately 50 wt % silver nanoparticles in bicyclohexane (BCH):phenylcyclohexane (3:2 by weight). The following procedure was used to make the ink. To 50 grams of silver nanoparticles powder in a brown glass container (120 mL), both bicyclohexane (30 g) and phenylcyclohexane (20 g) were added. The resulting mixture was mixed by gently shaking the sample using an orbital mixer for about 2 hours and then placed on a roll mill at low speed for 22 hours. After this period of mixing, the resulting mixture was filtered with a 1 um glass fiber syringe filter, yielding ~98 g of the conducting silver nanoparticle ink.

Comparative Example 3: Silver Nanoparticle Ink

A second silver nanoparticle ink sample was made that was similar to that of Example 2A, except that the approximately 50 wt % silver nanoparticles were dispersed in decalin:bicyclohexane (BCH) (3:2 by weight) instead of BCH and phenylcyclohexane.

Comparative Example 4: Synthesis of Silver Nanoparticles Using Dodecylamine (Control)

To a 2 L 3 neck round bottom flask, fitted with an overhead stirrer, thermometer, condenser, and Ar line, was added molten dodecylamine (444.77 g, melted overnight at 50° C. in oven). The reaction flask was immersed in warm water (35-40° C.). MeOH (29.26 mL) was added followed by decalin (149.78 mL). Phenylhydrazine (26.17 g) was added with magnetic stirring, using some of the decalin to complete the transfer. The mixture was stirred until completely homogeneous, and the temperature was allowed to stabilize at 35° C. Silver acetate powder was slowly added through the top of the flask, maintaining the temperature at 35-40° C. Silver acetate was added over a period of 120 minutes. The reaction mixture was stirred for an additional 1 hour at 40° C.

MeOH (750 mL) was added and stirred for 10 minutes. The reaction product was filtered using a Buchner funnel with 2 filter media (Whatman 934AH glass fibre paper on bottom and Whatman #54 filter paper on top). Filtration took about 40 minutes. Filtrate was dark brown and filter cake was greyish-blue.

The filtrate sample was put in a brown bottle, flushed with Argon and stored in fridge. Particle size of the nanoparticle was assessed by dynamic light scattering using a Malvern Nano Zetasizer and Nano Sizer and the results are shown in Table 1 below, where D[1,0] is the average size (i.e., number mean) of the particles.

Example 5: Synthesis of Silver Nanoparticles Using 100% Octylamine

To a 250 mL 3 neck round bottomed flask, fitted with a magnetic stir bar, thermometer, condenser, and Ar line, was added octylamine (31.01 g). The flask was immersed in warm water (35-40° C.). MeOH (1.50 mL) was added followed by decalin (7.49 mL). Phenylhydrazine (1.31 g) was added with stirring, using some of the decalin to complete the transfer. Stirred mixture until completely homogeneous, and allowed temperature to stabilize at 35° C. Slowly added silver acetate powder while maintaining the temperature below 40° C. Solution turned brown upon adding silver acetate. Added the silver acetate over a period of 45 minutes. Allowed the reaction mixture to stir for another 1 hour at 40° C.

MeOH (7.5 mL) was added and stirred for 10 minutes during which a blue coating was formed on the walls of the flask, an indication of the formation of nanoparticles. The reaction product was filtered on a Buchner funnel with 2 filter media (Whatman 934AH glass fiber paper on bottom and Whatman #54 filter paper on top) to give a bluish-grey filter cake and a brown filtrate. Washed filter cake with MeOH (25 mL). Filter cake was put in a 30 mL brown bottle, flushed with argon and stored in fridge. Particle size of the nanoparticle was assessed using Malvern dynamic light scattering and the results are shown in Table 1 below.

Example 6: Synthesis of Silver Nanoparticles Using a 20:80 Ratio of Dodecylamine to Octylamine To a 100 mL 3 neck round bottomed reaction flask fitted with a magnetic stir bar, thermometer, condenser, and Ar line, was added molten dodecylamine (22.21 g) and octylamine (79.21 g). The reaction flask was immersed in warm water (35-40° C.) and MeOH (7.5 mL) was added, followed by decalin (75 mL). Phenylhydrazine (13.09 g) was then added with stirring, using some of the decalin to complete the transfer. The mixture was stirred until completely homogeneous, and the temperature was allowed to stabilize at 35° C. Silver acetate (25 g) powder was slowly added through the top of the reaction flask while maintaining the temperature at 35-40° C. Silver acetate was added over 50 minutes and the reaction mixture was stirred for another 1 hour at 40° C. MeOH (187.5 mL) was added and the mixture was stirred for 10 minutes. The reaction product was filtered on a Buchner funnel with 2 filter media (Whatman 934AH glass fiber paper on bottom and Whatman #54 filter paper on top). Filtration took about 15 minutes. Filtrate was dark brown and wet filter cake was bluish-grey. The wet filter cake was put in a 30 ml brown bottle, flushed with Argon and stored in fridge. The $Z_{ave}$ particle size of the nanoparticle was assessed by dynamic light scattering using a Malvern Nano Zetasizer and Nano Sizer and the results are shown in Table 1 below, where D[1,0] is the number mean (i.e., the average) size of the particles. Silver content (Ash) was assessed using MLS PYRO High Temperature Microwave Ash Furnace and the data is shown in Table 1 below.

Example 7: Synthesis of Silver Nanoparticles Using a 30:70 Ratio of Dodecylamine to Octylamine Silver nanoparticles were synthesized using a similar procedure as in Example 6 except that a ratio of 30:70 dodecylamine to octylamine was used.

Example 8: Synthesis of Silver Nanoparticles Using a 50:50 Ratio of Dodecylamine to Octylamine Silver nanoparticles were synthesized using a similar procedure as in Example 6 except that a ratio of 50:50 dodecylamine to octylamine was used.

Example 9: Synthesis of Silver Nanoparticles Using a 60:40 Ratio of Dodecylamine to Octylamine Silver nanoparticles were synthesized using a similar procedure as in Example 6 except that a ratio of 60:40 dodecylamine to octylamine was used.

Example 10: Larger Scale Synthesis of Silver Nanoparticls Using a 60:40 Ratio of Dodecylamine to Octylamine Silver nanoparticles were synthesized using a similar procedure as in Example 9 except that the scale was increased 10 times.

TABLE 1

Silver Nanoparticles with Different Stabilizers. The amount of $R_1$ and $R_2$ are each shown as mole % based on a total molar amount of organoamine added as a stabilizer for making the metal nanoparticles.

| Particle ID | $R_1$ ($C_{12}$) (Mole %) | $R_2$ ($C_8$) (Mole %) | Scale AgOAc Weight (g) | Particle size (nm) $Z_{ave}$ | D[1, 0] | Ash (wt %) |
|---|---|---|---|---|---|---|
| Comparative Example 4 | 100% | 0 | 100 | 30 | 7.4 | ND |
| Example 5 | 0 | 100% | 5 | 433 | 7.3 | ND |
| Example 6 | 20% | 80% | 25 | 177.6 | 9.1 | 89.81 |
| Example 7 | 30% | 70% | 25 | 76.7 | 8.3 | ND |
| Example 8 | 50% | 50% | 35 | 10.3 | 7.8 | ND |
| Example 9 | 60% | 40% | 5 | 23 | 7.4 | 88.8 |
| Example 10 | 60% | 40% | 50 | 51 | 8 | ND |

Initial attempts to synthesize particles using higher percentages of octylamine (70-100%) as the stabilizer resulted in the formation of particles that were too large, as indicated by the $Z_{ave}$ shown in Examples 5 to 7 of Table 1, and therefore was not considered successful. Mixtures of 50-60% dodecylamine and 40-50% octylamine gave particles with acceptable particle size, as shown in Examples 8-10 of Table 1. Inks were formulated using some of the silver nanoparticles, as will be described in the examples below.

Comparative Example 11A: Preparation of Silver Concentrate (Control)

Silver nanoparticles (250.57 g), prepared as outlined in Example 2 of US2010/0240758A1 were added to a tared stainless steel jacketed beaker. Bicyclohexane (94.50 g) was added and the solvent was stirred with a spatula. The beaker was secured with clamps in a bath set to 26° C. A sawtooth agitator was lowered into the beaker and set at 400 RPM. A nitrogen septum needle was lowered into the beaker, 1 cm from bottom. The mixture was agitated for 10 minutes and then agitation was stopped. Big chunks of silver particles in the mixture were broken with a spatula. Agitation was continued for a total of 4 hours to give silver concentrate with the following properties: Ash (60.55%), $Z_{ave}$ (19.4 nm) and D[1,0] 7.4 nm. The concentrate was dispensed into two 250 mL amber glass bottles and purged with argon. The bottles were sealed with white tape and stored in the fridge.

Comparative Example 11 B: Preparation of Silver Nanoparticle Ink (Control)

Silver nanoparticle concentrate of control Example 11A (109.65 g) was transferred to a pre-weighted 120 mL amber bottle and weighted again. Bicyclohexane (10.16 g) and Phenylcyclohexane (30.01 g) were added. The mixture was blanketed with argon, sealed with 3M tape, labeled and placed on a Movil Rod overnight (about 18 hours). The resulting ink was filtered with 1 μm Pall Acrodisc glass fiber syringe filter, transferred to a pre-weighted amber glass bottle and labeled as the final ink. The bottle was purged with Argon, sealed with white 3M tape and store in a fridge. Table 2 below shows the ink formulation and resulting ink properties.

Example 12A: Preparation of s Silver Concentrate

To a 25 mL round bottom flask, fitted with a magnetic stir bar was added silver nanoparticles of Example 6 (7.4 g) and the flask was immersed in a water bath and the temperature was maintained at 8° C. by adding ice. Bicyclohexane (2.0 g) was added and argon was purged deep into the mixture using a long needle. The mixture was stirred (700 rpm) at 8° C. for 1.5 hours and at 23° C. for 6 hours to give silver concentrate with the following properties: Ash (69.38%). The concentrate was transferred to a 30 mL brown bottle, flushed with argon and stored in a fridge.

Example 12B: Preparation of Silver Nanoparticle Ink

Silver nanoparticle concentrate of Example 12A (6.80 g) was transferred to a pre-weighted 30 mL amber bottle and weighed again. Added bicyclohexane (3.58 g) and phenylcyclohexane (2.14 g) to the concentrate. The mixture was blanketed with argon, sealed with 3M tape, labeled and placed on orbital mixer for 2 hours followed by rolling on a Movil Rod for 22 hours. Resulting ink was filtered through a 1 μm Pall Acrodisc glass fiber syringe filter and transferred to a pre-weighted amber glass bottle and labeled as the final ink, purged with Argon, sealed with white 3M tape and stored in fridge. Table 2 below shows the ink formulation and resulting ink properties.

Example 13A: Preparation of Silver Concentrate

A procedure similar to that of Example 12A was followed except that the silver nanoparticles of Example 7 were used to make related silver concentrate. Table 2 below shows the ink formulation and resulting ink properties.

Example 13B: Preparation of Silver Nanoparticle Ink

A procedure similar to that of Example 12B was followed except that silver concentrate of Example 13A was used to make a silver ink. Table 2 below shows the ink formulation and resulting ink properties.

Example 14A: Preparation of Silver Concentrate

A procedure similar to that of Example 12A was followed except that silver nanoparticles of Example 8 were used to make a silver concentrate.

Example 14B: Preparation of Silver Nanoparticle Ink

A procedure similar to that of Example 12B was followed except that silver concentrate of Example 14A was used to make a silver ink. Table 2 below shows the ink formulation and resulting ink properties.

Example 15A: Preparation of Silver Concentrate

A procedure similar to that of Example 12A was followed except that silver nanoparticles of Example 10 were used to make a silver concentrate.

Example 15B: Preparation of Silver Nanoparticle Ink

A procedure similar to that of Example 12B was followed except that silver concentrate of Example 15A was used to make a silver ink. Table 2 below shows the ink formulation and resulting ink properties.

TABLE 2

Silver Nanoparticle Ink Formulation and Properties

| Ink Component | Lot # | Control Ink Example 11B (xcm-nsIJ) weight (g) | Ink Example 12B weight (g) | Ink Example 13B weight (g) | Ink Example 14B weight (g) | Ink Example 15B weight (g) |
|---|---|---|---|---|---|---|
| Silver concentrate | Example 11A | 109.6 | | | | |
| | Example 12A | | 6.80 | | | |
| | Example 13A | | | 7.04 | | |
| | Example 14A | | | | 32.24 | |
| | Example 15A | | | | | 7.04 |
| Bicyclohexane | ADDR001 (Solutia) | 10.39 | 3.58 | 3.29 | 14.46 | 1.76 |
| Phenylcyclohexane | 040215H17N (Oakwood Products) | 60.29 | 2.14 | 1.13 | 8.9 | 2.2 |
| Ink Properties | | | | | | |
| Viscosity (cps) | | 5.86 | ND | ND | 5.26 | 5 |
| $Z_{ave}$ (nm) | | 18.3 | ND | 10 | 12.4 | ND |
| D[1, 0] (nm) | | 7.3 | ND | 7.2 | 7.6 | ND |

The inks of Table 2 were jetted using a Dimatix inkjet printer onto glass substrates. The resulting films were annealed at different temperatures as shown in Table 3 below. Conductivity of the annealed films was determined using a Keithley 4200A-CSC to measure resistance and a Dektak stylus profile to measure film thickness. The nanoparticle ink of the present disclosure (e.g., inks of Examples 14B and 15B) gave highly conductive films at lower temperatures compared to the control ink of Example 11 B, indicating that the use of a combination of octylamine and dodecylamine as a stabilizer significantly reduced the annealing temperature.

TABLE 3

Silver Nanoparticle Ink Conductivities at Different annealing Temperatures and Times

| | Conductivity (S/cm) | | |
|---|---|---|---|
| Ink ID | 60° C./10 min | 60° C./30 min | 80° C./30 min |
| Ink of Example 11B with dodecylamine alone (Control) | Not Conductive | Not Conductive | 60000 |
| Ink of Example 12B | 0.2 | 0.5 | 60300 |
| Ink of Example 13B | 5940 | 15800 | 67900 |
| Ink of Example 14B | 47900 | 82100 | 135000 |
| Ink of Example 15B | 1.1 | 60000 | 92000 |

As shown by the results above, silver nanoparticles were effectively stabilized using a mixture of octylamine and dodecylamine binders. The lower boiling point of octylamine resulted in a particle with a lower annealing temperature than a particle with 100% dodecylamine stabilizer. The particles had a very small particle size. The inkjet inks formulated from the particles of this disclosure were able to be annealed at very low temperatures (e.g., 60° C.) in a short time (e.g., 10-30 minutes) to give highly conductive traces (e.g., >10,000 s/cm). This will enable the printing of conductive traces on many substrates that are sensitive to high temperatures, such as plastic films and polymeric objects, making it possible to create smart components for many applications.

Example 16: Preparation of the Phase Change Material

Phase change inks were prepared with the ink components according to Table 4 below (Phase Change Materials 1 to 4)

TABLE 4

| | Phase Change Material (wt %) | | | |
|---|---|---|---|---|
| Ink Component | Phase Change Material 1 | Phase Change Material 2 | Phase Change Material 3 | Phase Change Material 4 |
| Distilled Polywax 500 (X1197) | 53.34 | | | |
| Distearyl Terepthalate (DST, 80% BRC) | | 79.89 | 79.80 | 79.86 |
| TBCT * | | 19.94 | | |
| Sylvatac RE40 (80% BRC**) | | | 20.03 | |
| Abitol E Succinic Acid di-ester (100% BRC) | | | | 19.97 |
| Triamide Wax (Xerox Resin 6) | 12.92 | | | |
| Stearyl stearamide (S-180) | 15.27 | | | |
| triglycerides of hydrogenated abietic acid (KE-100) | 16.15 | | | |
| Urethane Resin (Xerox Resin 12) | 2.15 | | | |
| N-445 | 0.17 | 0.17 | 0.17 | 0.17 |
| TOTAL | 100 | 100 | 100 | 100 |
| ***Viscosity at 140° C. | 4.37 | | | |

* TBCT is a reaction product of a 1:1:1 molar ratio of 4-t-butylcyclohexanol, cyclohexanol and tartaric acid, synthesized as outlined in U.S. Pat. 8,500,896.

Distearyl terephthalate was prepared according to the procedure disclosed in U.S. Pat. No. 8,753,441, of which is incorporated herein by reference.

Preparation of Phase Change Material 1

Phase change material 1 was prepared according to the procedure disclosed in Example II of U.S. Pat. No. 7,381,254 except that a colorant was not included in the phase change material 1 herein. The disclosure of U.S. Pat. No. 7,381,254 is incorporated herein its entirety.

Preparation of Phase Change Material 2

Phase change material 2 was prepared by melt mixing Distearyl Terepthalate and TBCT in a beaker with stirring at 130° C. for about 1 hr, according to the procedure disclosed in U.S. Pat. No. 8,741,043. The resulting mixture was poured in aluminum pans and cooled to room temperature.

Preparation of Phase Change Material 3

Phase change material 3 was prepared by melt mixing Distearyl Terepthalate and Sylvatac RE 40 (a commercial rosin ester disclosed in U.S. Pat. No. 9,120,943) in a beaker with stirring at 130° C. for about 1 hr. The resulting mixture was poured in aluminum pans and cooled to room temperature.

Preparation of Phase Change Material 4

Phase change material 4 was prepared according to the procedure disclosed in Example I of U.S. Pat. No. 8,741,043 except that a colorant was not included in the phase change material 4 herein.

Example 17: Preparation of UV Curable Overcoat Material

UV curable overcoat material is prepared by adding at least one oligomer, and at least one difunctional or multi-functional monomer (tri-functional or higher monomers) to a glass container with a magnetic stirring rod. The compositions is allowed to stir on a Vario-Mag® heated stirring block at about 85° C. for about 20 minutes. After the compositions is mixed to form a homogeneous liquid mixture, optional additional monofunctional monomers and at least one photoinitiator is added, and mixed for another approximately 30 minutes to furnish the final mixed UV curable compositions. The UV curable compositions is filtered through 1 μm filter cloth (available from Parker). The UV curable composition is shown in Table 5.

TABLE 5

UV Curable Overcoat Composition

| | UV Curable Overcoat Material (wt %) |
|---|---|
| SR506A (isobornyl acrylate) | 39.40 |
| SR272 (TriEGDA-Triehylene glycol diacrylate) | 16.10 |
| SR268 (TetraEGDA-Tetraethylene glycol diacrylate) | 7.36 |
| SR368 (tris-2-hydroethyl acrylate isocyanurate) | 12.00 |
| BR-741 (Bomar-Aliphatic polyester urethane acrylate) | 21.80 |
| BR-952 (Urethane acrylate oligomer) IC TPO (Diphenyl(2,4,6-trimethyl-benzoyl)phosphine oxide) | 2.30 |
| Irgacure 184 | 1.00 |
| Total | 100 |
| Viscosity at 80° C. (cps) | 5.42 |

Viscosity was measured using an Ares G2 rheometer equipped with a 25 mm Parallel plate and Peltier heating system. Samples of the UV Curable compositions were loaded on the rheometer at 102° C., allowed to equilibrate, then swept over temperature to 25° C. at a rate of 1.5° C./min at 10 rad/s.

Example 18: Preparation of an Embedded 3D Conductive Object

Figure 2:
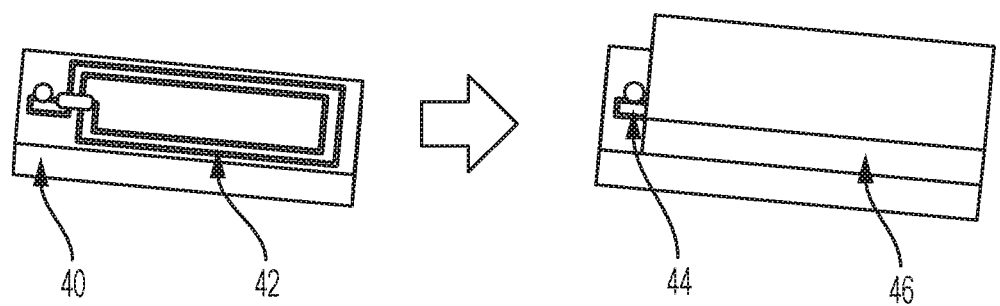
FIG. 2 illustrates an embedded antenna made from embodiments disclosed herein.

FIG. 2 shows a fully printed antenna is fabricated on the 3D structure of a phase change material prepared in Example 16 (i.e., Phase change materials 1-4). To demonstrate the compatibility of the materials disclosed above and the ability to use them to print 3D printed articles. A metal nanoparticle ink composition of the present disclosure is used to fabricate an antenna. FIG. 2 shows a first structural material forming a base 40 using the process described herein to form the 3D structure. A metal nanoparticle ink is jetted onto the first structural material to form conductive trace 42. The ink is jetted using a Dimatix inkjet printer. Conductive lines are annealed in a conventional oven at 80° C. for 20 minutes. A UV curable overcoat material of example 17 is coated on top of the conductive traces 42. Overcoat Example 17 is cured using LED curing for 500 ms at 100 percent power, with a gap of lamp to substrate of 5 mm. The UV light is supplied by Phoseon FireJet FJ200 150-20 (emitting window dimensions [mm]) 395 nm (wavelength) and 8 W/cm$^2$ (power). A second structural material is then jetted over the cured overcoat composition 17 to form topcoat 46 thereby forming a conductive trace 42 and embedded between topcoat 46 and base 40. Structure 46 is fabricated in the same way as structure 40. LED 44 is connected to the conductive trace 42. When the 3D printed antenna with connected LED comes in contact with a wireless emitter, the LED lights indicating that the antenna is working. Example 18 indicated that the process disclosed herein can be used to fabricate fully printed electronic circuits.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

Example 19: Preparation of Free-Standing Antenna

The printed conductive antenna of example 18 is heated at a temperature of about 90° C. The phase change structural materials 40 and 46 in FIG. 2 melt away leaving a free standing antenna.

All the patents and applications referred to herein are hereby specifically, and totally incorporated herein by reference in their entirety in the instant specification.

What is claimed is:

1. A method of forming a three-dimensional (3D) article comprising a conductive article, the method comprising:
providing a first 3D structural material;
depositing a metal nanoparticle ink composition on a surface of the first 3D structural material;
annealing the metal nanoparticle ink composition at a temperature of between 60° C. and 100° C. to form the conductive article on the first 3D structural material;
optionally forming a second 3D structural material over the conductive article; and
melting the first 3D structural material and/or the optional second 3D structural material, thereby forming a free-standing conductive article.

2. The method of claim 1, wherein the metal nanoparticle ink composition comprises:
an ink vehicle; and
a plurality of metal nanoparticles dispersed in the ink vehicle, the metal nanoparticles including two or more organic stabilizing groups attached thereto, an alkyl moiety of the first organic stabilizing group having a longer carbon chain length than the alkyl moiety of the second organic stabilizing group, the first organic stabilizing group being selected from the group consisting of decylamine, undecylamine, dodecylamine, tridecylamine, tetradecylamine and mixtures thereof, and the second organic stabilizing group being selected from group consisting of butylamine, pentylamine, hexylamine, heptylamine, octylamine, nonylamine, decylamine and mixtures thereof.

3. The method of claim 2, wherein the metal nanoparticles have a size ranging from about 0.5 nm to about 100 nm, as measured by TEM.

4. The method of claim 2, wherein the metal nanoparticles comprise at least one metal selected from the group consisting of Al, Ag, Au, Pt, Pd, Cu, Co, Cr, In and Ni.

5. The method of claim 2, wherein the ink vehicle comprises a first solvent and a second solvent, the first solvent being nonpolar and having a boiling point above 160° C. at 1 atmosphere pressure, and the second solvent having a boiling point above 230° C. at 1 atmosphere pressure, the second solvent being an aromatic hydrocarbon and having a higher boiling point than the first solvent.

6. The method of claim 5, wherein the first solvent is a saturated or unsaturated $C_{10}$ to $C_{20}$ hydrocarbon having at least one cyclic group and the second solvent is a $C_{10}$ to $C_{18}$ arylcycloalkane.

7. The method of claim 5, wherein the first solvent is a compound selected from the group consisting of bicyclohexane, decalin, naphthalene and combinations thereof, and the second solvent is phenylcyclohexane.

8. The method of claim 1, wherein the first 3D structural material and the optional second 3D structural material are formed by a process comprising:
providing a phase change material;
heating the phase change material to a jetting temperature;
jetting the phase change material in layers on top of one another, wherein each layer is allowed to cool and/or solidify before jetting a subsequent layer; and
forming the first 3Dstructural material and the optional second 3D structural material from the cool and/or solidified layers.

9. The method of claim 8, wherein the phase change material comprises a crystalline compound and an amorphous compound.

10. The method of claim 8, wherein the crystalline compound is selected from the group consisting of dibenzyl hexane-1,6-diyldicarbamate, distearyl terepthalate, polyethylene wax, di-phenylethyl-(L)-tartarate, stereoisomers thereof and mixtures thereof.

11. The method of claim 8, wherein the amorphous compound is selected from the group consisting of triglycerides of hydrogenated abietic acid, Abitol E succinic acid, Abitol E tartaric acid, dimenthol tartrate, t-Butylcyclohexyl-Cyclohexyl Tartrate, trimenthol citrate, and mixtures thereof.

12. The method of claim 8, wherein cooling and/or solidifying the jetted layer takes from about 1 to about 10 seconds.

13. The method of claim 8, wherein the phase change material having a viscosity of about $10^4$ cps to about $10^6$ cps at a temperature of about 30° C.

14. The method of claim 8, wherein the viscosity of the phase change material is not altered after the annealing step.

15. A method of forming a three-dimensional (3D) article comprising an embedded conductive article, the method comprising:
providing a first 3D structural material;
depositing a conductive metal ink composition on a surface of the first 3D structural material;
annealing the conductive metal ink composition at a temperature of between 60° C. and 100° C. to form the conductive article on the first 3D structural material;
forming a second 3D structural material over the conductive article, thereby embedding the conductive article therein; and
melting the first 3D structural material and/or the optional second 3D structural material, thereby forming a free-standing conductive article.

16. The method of claim 15, wherein the metal nanoparticle ink composition comprises:
an ink vehicle; and
a plurality of metal nanoparticles dispersed in the ink vehicle, the metal nanoparticles including both a first organic stabilizing group and a second organic stabilizing group attached thereto, an alkyl moiety of the first organic stabilizing group having a longer carbon chain length than the alkyl moiety of the second organic stabilizing group, the first organic stabilizing group being selected from the group consisting of decylamine, undecylamine, dodecylamine, tridecylamine, tetradecylamine and mixtures thereof, and the second organic stabilizing group is selected from group consisting of butylamine, pentylamine, hexylamine, heptylamine, octylamine, nonylamine, decylamine and mixtures thereof.

17. The method of claim 15, wherein both the first 3D structural material and the second 3D structural material comprise a phase change material, the phase change material comprises a crystalline compound and an amorphous compound.

18. A method of forming a free-standing conductive article, comprising the steps of:
providing a first 3D structural material;
depositing a conductive metal ink composition on a surface of the first 3D structural material;
annealing the conductive metal ink composition at a temperature of between 60° C. and 100° C. to form the conductive article on the first 3D build material; and
melting the first 3D structural material, thereby forming a free-standing conductive article.

19. The method of claim 18, wherein the metal nanoparticle ink composition comprises:
an ink vehicle; and
a plurality of metal nanoparticles dispersed in the ink vehicle, the metal nanoparticles including two or more organic stabilizing groups attached thereto, the two or more organic stabilizing groups being selected from the group consisting of butylamine, pentylamine, hexylamine, heptylamine, octylamine, nonylamine, decylamine, undecylamine, dodecylamine, tridecylamine, tetradecylamine, hexadecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine and trihexylamine.

* * * * *